US009830850B2

(12) United States Patent
Sun

(10) Patent No.: US 9,830,850 B2
(45) Date of Patent: Nov. 28, 2017

(54) SHIFT REGISTER, DISPLAY DEVICE AND METHOD FOR DRIVING SHIFT REGISTER

(71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/105,867

(22) PCT Filed: Jan. 6, 2016

(86) PCT No.: PCT/CN2016/070225
§ 371 (c)(1),
(2) Date: Jun. 17, 2016

(87) PCT Pub. No.: WO2017/016190
PCT Pub. Date: Feb. 2, 2017

(65) Prior Publication Data
US 2017/0206824 A1    Jul. 20, 2017

(30) Foreign Application Priority Data

Jul. 29, 2015   (CN) .......................... 2015 1 0456936

(51) Int. Cl.
*G11C 19/00*    (2006.01)
*G09G 3/20*    (2006.01)
(Continued)

(52) U.S. Cl.
CPC ........... *G09G 3/2092* (2013.01); *G11C 19/28* (2013.01); *G09G 3/3677* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

2007/0242531 A1   10/2007  Ku et al.
2016/0035262 A1*  2/2016  Lee .................. G11C 19/28
                                         345/690
(Continued)

FOREIGN PATENT DOCUMENTS

CN    1773572 A    5/2006
CN    101354924 A    1/2009
(Continued)

OTHER PUBLICATIONS

International Search Report dated Apr. 29, 2016 issued in corresponding International Application No. PCT/CN2016/070225 along with an English translation of the Written Opinion of the International Searching Authority.

*Primary Examiner* — Tuan T Lam
(74) *Attorney, Agent, or Firm* — Nath, Goldberg & Meyer; Joshua B. Goldberg

(57) ABSTRACT

The present invention provides a shift register, in which first and second shifting modules are turned on by the first input module according to a first clock signal; the first shifting module shiftingly outputs a first input signal when it is on; a first reset module turns off the first shifting module according to a third clock signal and outputs the first input signal; the second shifting module shiftingly outputs a second input signal when it is on; a second input module outputs a turning-on signal or a turning-off signal to a second reset module according to the first clock signal; a second reset module outputs the second input signal when it is turned on; and a third input module turns off the second shifting module according to the second clock signal. The first, second and third clock signals have a same clock period and a same duty cycle.

20 Claims, 4 Drawing Sheets

(51) Int. Cl.
    *G11C 19/28*     (2006.01)
    *G09G 3/36*     (2006.01)

(56) References Cited

U.S. PATENT DOCUMENTS

| | | | |
|---|---|---|---|
| 2016/0105184 A1* | 4/2016 | Qian | H03K 19/0944 |
| | | | 345/214 |
| 2016/0365035 A1* | 12/2016 | Park | G09G 3/3266 |
| 2017/0116926 A1* | 4/2017 | Bong | G09G 3/3266 |
| 2017/0125493 A1* | 5/2017 | Jinta | H01L 27/3244 |

FOREIGN PATENT DOCUMENTS

| | | |
|---|---|---|
| CN | 103208251 A | 7/2013 |
| CN | 104658506 A | 5/2015 |
| CN | 104978922 A | 10/2015 |

\* cited by examiner

SHIFT REGISTER, DISPLAY DEVICE AND METHOD FOR DRIVING SHIFT REGISTER

This is a National Phase Application filed under 35 U.S.C. 371 as a national stage of PCT/CN2016/070225, filed Jan. 6, 2016, an application claiming the benefit of Chinese Application No. 201510456936.X, filed Jul. 29, 2015, the content of each of which is hereby incorporated by reference in its entirety.

FIELD OF THE INVENTION

The present invention relates to the field of display technology, and specifically relates to a shift register, a display device and a method for driving the shift register.

BACKGROUND OF THE INVENTION

Two different kinds of signals are required to drive pixels of a conventional low-temperature poly-silicon (LIPS) thin-film transistor liquid crystal display and an active matrix organic light-emitting diode (AMOLED) panel. One is a signal obtained by superimposing a low-level pulse on a high-level voltage, i.e., a constantly high-level signal superimposed with a low-level pulse, which is used to control scanning of gate lines and thus referred to as a scanning voltage signal, and the other is a signal obtained by superimposing a high-level pulse on a low-level voltage, i.e., a constantly low-level signal superimposed with a high-level pulse, which is used to control data writing for data lines and thus referred to as a data input signal.

At present, two different types of shift registers are required to output the above two signals, and two sets of clock signals with different pulse widths are required to drive the above two different shift registers, respectively, due to the different pulse widths of the above two signals, wherein each set of clock signals comprises two clock signals. Therefore, two shift registers and two clock signal circuits have to be arranged within a frame area of a display device in the prior art, resulting in a too wide frame of the display device.

SUMMARY OF THE INVENTION

The present invention intends to solve at least one technical problem existing in the prior art, and provides a shift register, a display device and a method for driving the shift register.

To solve one of the above problems, the present invention provides a shift register, which includes a first input module, a second input module, a third input module, a first shifting module, a second shifting module, a first reset module and a second reset module. The first input module is connected with a first input terminal of the shift register, the first shifting module and the second shifting module, and is configured to output a first turning-on signal to the first and second shifting modules according to a first clock signal. The first shifting module has an output terminal connected to a first output terminal of the shift register, and is configured to be turned on when receiving the first turning-on signal and shiftingly output a first input signal inputted by the first input terminal. The first reset module is connected with the first input terminal and the first shifting module and has an output terminal connected to the first output terminal of the shift register, and is configured to turn off the first shifting module according to a third dock signal and output the first input signal when the first shifting module is turned off so as to perform reset. The second shifting module has an output terminal connected to a second output terminal of the shift register, and is configured to be turned on when receiving the first turning-on signal and shiftingly output a second input signal inputted by a second input terminal. The second input module is connected with the second input terminal and the second reset module, and is configured to output a second turning-on signal or a turning-off signal to the second reset module according to the first clock signal. The second reset module has an output terminal connected to the second output terminal, and is configured to be turned on when receiving the second turning-on signal and output the second input signal so as to perform reset. The third input module is connected with the second input terminal and the second shifting module, and is configured to turn off the second shifting module according to a second clock signal. The first, second and third dock signals are a set of clock signals having a same dock period and a same duty cycle.

Specifically, the first input module includes a first transistor, wherein a control electrode of the first transistor is connected to a first dock signal terminal, a first electrode of the first transistor is connected to the first input terminal and serves as an input terminal of the first input module, and a second electrode of the first transistor is connected to an input terminal of the first shifting module and serves as an output terminal of the first input module, the first clock signal terminal being configured to allow the first clock signal to be inputted therethrough.

Specifically, the first shifting module includes a sixth transistor and a second storage capacitor. A control electrode of the sixth transistor is connected to the output terminal of the first input module and serves as the input terminal of the first shifting module, a first electrode of the sixth transistor serves as an output terminal of the first shifting module, and a second electrode of the sixth transistor is connected to a second clock signal terminal through which the second clock signal is inputted. A first end of the second storage capacitor is connected to the first electrode of the sixth transistor, and a second end of the second storage capacitor is connected to the control electrode of the sixth transistor.

Specifically, the first reset module includes a second transistor, a third transistor, a fourth transistor, a fifth transistor and a first storage capacitor. A control electrode of the third transistor is connected to the first input terminal, a first electrode of the third transistor is connected to a first-level input terminal, and a second electrode of the third transistor is connected to a control electrode of the fifth transistor. The first-level input terminal is configured to allow a first-level signal to be inputted therethrough. A first electrode of the fifth transistor is connected to the first electrode of the third transistor, and a second electrode of the fifth transistor serves as an output terminal of the first reset module. A control electrode of the second transistor is connected to the second electrode of the third transistor, a first electrode of the second transistor is connected to the first-level input terminal, and a second electrode of the second transistor is connected to the input terminal of the first shifting module. A first end of the first storage capacitor is connected to the first electrode of the fifth transistor, and a second end of the first storage capacitor is connected to the control electrode of the fifth transistor. A control electrode of the fourth transistor is connected to a third clock signal terminal, a first electrode of the fourth transistor is connected to the second electrode of the third transistor, and a second electrode of the fourth transistor is connected to a second-level input terminal. The third clock signal terminal is configured to allow the third clock signal to be inputted therethrough. The second-level input terminal is configured to allow a second-level signal to be inputted therethrough, the first level being one of a high level and a low level, and the second level being the other.

Specifically, the second input module includes a seventh transistor, wherein a control electrode of the seventh transistor is connected to the first clock signal terminal, a first electrode of the seventh transistor is connected to the second input terminal and serves as an input terminal of the second input module, and a second electrode of the seventh transistor is connected to an input terminal of the second reset module and serves as an output terminal of the second input module. The first clock signal terminal is configured to allow the first clock signal to be inputted therethrough.

Specifically, the second input module further includes a thirteenth transistor, wherein a control electrode of the thirteenth transistor is connected to the first output terminal, a first electrode of the thirteenth transistor is connected to the first electrode of the seventh transistor, and a second electrode of the thirteenth transistor is connected to the second electrode of the seventh transistor.

Specifically, the second reset module includes a fourth storage capacitor and a twelfth transistor, wherein a control electrode of the twelfth transistor is connected to the output terminal of the second input module and serves as the input terminal of the second reset module, a first electrode of the twelfth transistor serves as an output terminal of the second reset module, and a second electrode of the twelfth transistor is connected to the second-level input terminal. The second-level input terminal is configured to allow a second-level signal to be inputted therethrough. A first end of the fourth storage capacitor is connected to the control electrode of the twelfth transistor, and a second end of the fourth storage capacitor is connected to the second-level input terminal.

Specifically, the second reset module includes the fourth storage capacitor and the twelfth transistor, wherein the control electrode of the twelfth transistor is connected to the output terminal of the second input module and serves as the input terminal of the second reset module, the first electrode of the twelfth transistor serves as an output terminal of the second reset module, and the second electrode of the twelfth transistor is connected to the second-level input terminal. The second-level input terminal is configured to allow the second-level signal to be inputted therethrough. The first end of the fourth storage capacitor is connected to the control electrode of the twelfth transistor, and the second end of the fourth storage capacitor is connected to the second clock signal terminal. The second clock signal terminal is configured to allow the second clock signal to be inputted therethrough.

Specifically, the second shifting module includes an eighth transistor, an eleventh transistor and a third storage capacitor, wherein a control electrode of the eighth transistor is connected to the input terminal of the first shifting module, a first electrode of the eighth transistor is connected to a control electrode of the eleventh transistor, and a second electrode of the eighth transistor is connected to the second-level input terminal through which the second-level signal is inputted. The control electrode of the eleventh transistor is connected to an output terminal of the third input module, a first electrode of the eleventh transistor is connected to the first clock signal terminal, and a second electrode of the eleventh transistor serves as an output terminal of the second shifting module, the first clock signal terminal being configured to allow the first clock signal to be inputted therethrough. A first end of the third storage capacitor is connected to the first-level input terminal, and a second end of the third storage capacitor is connected to the control electrode of the eleventh transistor. The first-level input terminal is configured to allow a first-level signal to be inputted therethrough, the first level being one of a high level and a low level, and the second level being the other.

Specifically, the third input module comprises a ninth transistor and a tenth transistor, wherein a control electrode of the tenth transistor is connected to the second clock signal terminal, a first electrode of the tenth transistor connected to the first-level input terminal, and a second electrode of the tenth transistor is connected to a first electrode of the ninth transistor, the second clock signal terminal being configured to allow the second clock signal to be inputted therethrough, and the first-level input terminal being configured to input the first-level signal. A control electrode of the ninth transistor is connected to the second input terminal, and a second electrode of the ninth transistor is connected to the second shifting module and serves as the output terminal of the third input module.

Specifically, the first to thirteenth transistors are P-type transistors. Alternatively, the first to thirteenth transistors are N-type transistors. Alternatively, a part of the first to thirteenth transistors are P-type transistors, and remaining part of the first to thirteenth transistors are N-type transistors.

Specifically, the first input signal is one of a high-level signal superimposed with a low-level pulse and a low-level signal superimposed with a high-level pulse, and the second input signal is the other. A sum of pulse widths of the first and second input signals equals to the clock period, and the pulses of the first and second input signals start at a same time. Effective signal widths of the first, second and third clock signals are equal to the pulse width of the first input signal, a delay time for the second clock signal relative to the first clock signal is equal to the pulse width of the first input signal, and a delay time for the third clock signal relative to the second clock signal is equal to the pulse width of the first input signal.

Specifically the pulse width of the first input signal is equal to one third of the clock period, and the pulse width of the second input signal is equal to two thirds of the clock period.

As another aspect, the present invention also provides a display device, which includes the shift register provided by an aspect of the present invention.

As yet another aspect, the present invention also provides a method for driving the shift register provided by an aspect of the present invention, which includes the following steps. In a shift outputting step, the first and second input modules are turned on, the first and second shifting modules are turned on by the first input module, and the second reset module is turned off by the second input module; the first shifting module shiftingly outputs the first input signal inputted through the first input terminal, and the second shifting module shiftingly outputs the second input signal inputted through the second input terminal. In a reset output step, the first reset module, the second input module and the third input module are turned on, the first shifting module is turned off by the first reset module, the second reset module is turned on by the second input module, and the second shifting module is turned off by the third input module; the first reset module outputs the first input signal, and the second reset module outputs the second input signal.

Specifically, the first input signal is one of a high-level signal superimposed with a low-level pulse and a low-level signal superimposed with a high-level pulse, and the second input signal is the other. A sum of pulse widths of the first and second input signals equals to the clock period, and the pulses of the first and second input signals start at a same time. Effective signal widths of the first, second and third clock signals are equal to the pulse width of the first input signal, a delay time for the second clock signal relative to the first clock signal is equal to the pulse width of the first input signal, and a delay time for the third clock signal relative to the second clock signal is equal to the pulse width of the first input signal. The method for driving the shift register includes the following steps. In a first stage, the first clock signal is active to turn on the first and second input modules, the first and second shifting modules are turned on by the first input module, the second reset module is turned off by the second input module, the first shifting module outputs an inverted signal of the first input signal, and the second shifting module outputs an inverted signal of the second input signal. In a second stage, the second clock signal is active, the first and second input modules are turned off, the first and second shifting modules both are maintained in the on state, the second reset module is maintained in the off state, the first shifting module outputs the inverted signal of the first input signal, and the second shifting module outputs the second input signal. In a third stage, the third clock signal is active, the first input module, the second input module and the second reset module all are maintained in the off state, the second reset module is maintained in the on state, the first reset module is turned on, the first shifting module is turned off by the first reset module, the first reset module outputs the first input signal, and the second shifting module outputs an inverted signal of the second input signal. In a fourth stage, the first clock signal is active, the first and second input modules are turned on, the first shifting module is turned off by the first input module, the second reset module is turned on by the second input module, the first reset module and the second shifting module both are maintained in the on state, the first reset module outputs the first input signal, and the second shifting module and/or the second reset module output the second input signal. In a fifth stage, the second clock signal is active, the first and second input modules are turned off, the third input module is turned on, the second shifting module is turned off by the third input module, the first shifting module is maintained in the off state, the first and second reset modules both are maintained in the on state, the first reset module outputs the first input signal, and the second reset module outputs the second input signal.

Specifically, the pulse width of the first input signal is equal to one third of the clock period, and the pulse width of the second input signal is equal to two thirds of the clock period.

Specifically, the first, second and third clock signals have an effective signal level equal to the pulse level of the first input signal, which is either a low level or a high level. In the first stage, the first shifting module outputs the second clock signal, and the second shifting module outputs the first clock signal. In the second stage, the first shifting module outputs the second clock signal, and the second shifting module outputs the first clock signal. In the third stage, the first reset module outputs the first input signal, and the second shifting module outputs the first clock signal. In the fourth stage, the first reset module outputs the first input signal, the second shifting module outputs the first clock signal, and/or the second reset module outputs the second input signal. In the fifth stage, the first reset module outputs the first input signal, and the second reset module outputs the second input signal.

The beneficial effects of the present invention are as follows.

In the shift register provided by the present invention, the first turning-on signal is outputted to the first and second shifting module by the first input module according to the first clock signal, and then the first input signal, inputted through the first input terminal, is shiftingly outputted through the first output terminal after the first shifting module is turned on. Thereafter, the first shifting module is turned off by the first reset module according to the third clock signal, while the first input signal, inputted through the first input terminal, is outputted through the first output terminal so as to achieve a reset operation, thereby implementing the shifting output of the first input signal. The second shifting module is turned on at the same time as the first shifting module, such that the second input signal, inputted through the second input terminal, is shiftingly outputted through the second output terminal. Then the second shifting module is turned off by the third input module according to the second clock signal, and the second turning-on signal is outputted to the second reset module by the second input module according to the first clock signal, and, after the second reset module is turned on, the second reset module allows the second input signal inputted through the second input terminal to be outputted through the second output terminal so as to perform reset, thereby implementing the shifting output for the second input signal. The first, second and third clock signal belong to the same set of clock signals. Therefore, it can be seen from the foregoing that the shift register provided by the present invention can shiftingly output both the first and second input signals, which are used for controlling the scanning of gate lines and the data writing of data lines, respectively, and only one set of clock signals is required. Compared to existing technical solutions, one additional set of clock signals is omitted, so the area occupied by the periphery circuit is reduced, thereby solving the problem of a too wide frame of a display device.

In the display device provided by the present invention, the area occupied by the periphery circuit is reduced due to the employment of the shift register provided by an aspect of the present invention, thereby solving the problem of a too wide frame of a display device.

In the method for driving the shift register provided by an aspect of the present invention, it includes the shift outputting step and the reset output step. In the shift outputting step, the first and second input modules are turned on, the first and second shifting modules are turned on by the first input module, and the second reset module is turned off by the second input module; the first shifting module shiftingly outputs the first input signal inputted through the first input terminal (i.e., the first input signal is shiftingly outputted through the first output terminal), and the second shifting module shiningly outputs the second input signal inputted through the second input terminal (i.e., the second input signal is shiftingly outputted through the second output terminal). In the reset output step, the first reset module, the second input module and the third input module are turned on, the first shifting module is turned off by the first reset module, the second reset module is turned on by the second input module, and the second shifting module is turned off by the third input module; the first reset module outputs the first input signal (i.e., the first output terminal is reset), and the second reset module outputs the second input signal (i.e., the second output terminal is reset), thereby completing the shifting output of the first and second input signals. Therefore, by using of the method for driving the shift register provided by the present invention, both the first and second input signals, which are used for controlling the scanning of gate lines and the data writing of data lines, can be shiftingly outputted respectively, and only one set of clock signals is required. Compared to existing technical solutions, one additional set of clock signals is omitted, so the area occupied by the periphery circuit is reduced, thereby solving the problem of a too wide frame of a display device.

DETAILED DESCRIPTION OF THE EMBODIMENTS

To make those skilled in the art better understand the technical solutions of the present invention, a shift register, a display device and a method for driving the shift register provided by the present invention will be described in detail below in conjunction with the accompanying drawings.

It should be understood that although the terms "first", "second", "third" etc. may be used herein to describe various elements, signals and/or parts, these elements, signals and/or parts should not be limited by these terms. These terms are only used to distinguish one element, signal and/or part from another unless it indicates otherwise. Thus, a "first" element, signal and/or part discussed below could be termed as a "second" element, signal and/or part without departing from the teachings of the present invention.

Figure 1:
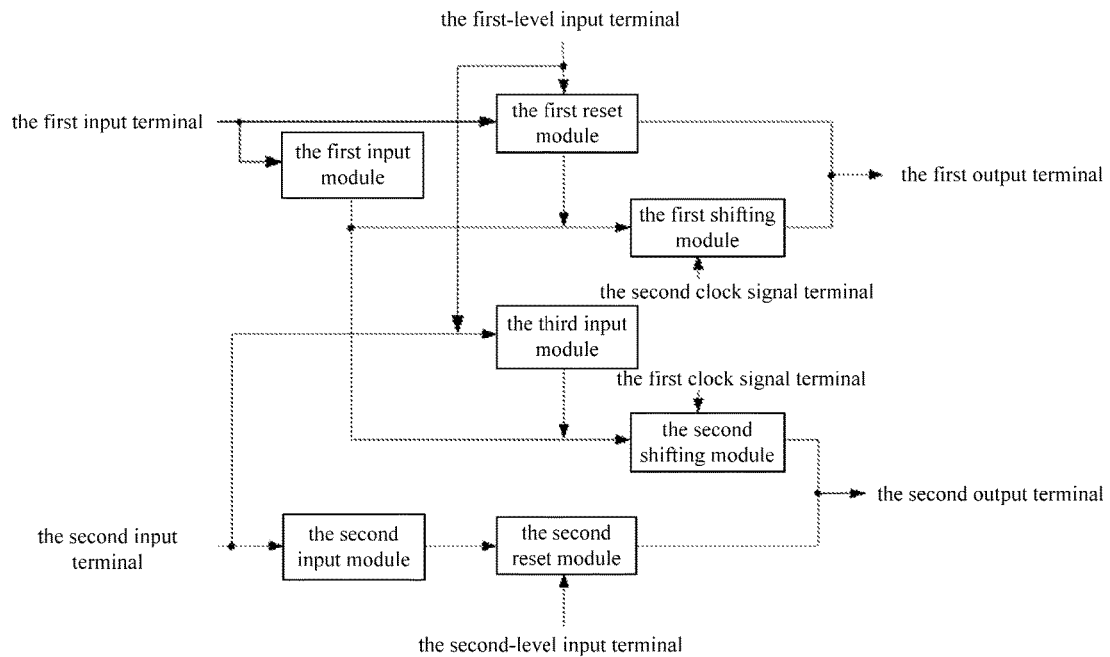
FIG. 1 is a block diagram of a shift register provided by an embodiment of the present invention.

FIG. 1 is a block diagram of a shift register provided by an embodiment of the present invention. Referring to FIG. 1, the shift register provided by this embodiment includes a first input module, a second input module, a third input module, a first shifting module, a second shifting module, a first reset module and a second reset module. The first input module is connected with a first input terminal of the shift register, the first shifting module and the second shifting module, and is configured to output a first turning-on signal to the first and second shifting modules according to a first clock signal. Specifically, The first shifting module has an output terminal connected to a first output terminal of the shift register, and is configured to be turned on when receiving the first turning-on signal and shiftingly output a first input signal inputted by the first input terminal of the shift register. The first reset module is connected with the first input terminal of the shift register as well as the first shifting module and has an output terminal connected to the first output terminal of the shift register, and is configured to turn off the first shifting module according to a third clock signal and output the first input signal when the first shifting module is turned off so as to perform reset. The second shifting module has an output terminal connected to a second output terminal of the shift register, and is configured to be turned on when receiving the first turning-on signal and shiftingly output a second input signal inputted by a second input terminal of the shift register. The second input module is connected with the second input terminal of the shift register as well as the second reset module, and is configured to output a second turning-on signal or a turning-off signal to the second reset module according to the first clock signal.

The second reset module has an output terminal connected to the second output terminal of the shift register, and is configured to be turned on when receiving the second turning-on signal and output the second input signal inputted by the second input terminal of the shift register so as to perform reset. The third input module is connected with the second input terminal of the shift register and the second shifting module, and is configured to turn off the second shifting module according to a second clock signal. The first, second and third clock signals are a set of dock signals having a same clock period and a same duty cycle.

In the above structure of the shift register, the output terminal of the first shifting module is connected with the output terminal of the first reset module at a connection node serving as the first output terminal of the shift register, which corresponds to the first input terminal of the shift register. The output terminal of the second shifting module is connected with the output terminal of the second reset module at a connection node serving as the second output terminal of the shift register, which corresponds to the second input terminal of the shift register.

In the shift register provided by this embodiment, the first turning-on signal is firstly outputted to the first and second shifting modules by the first input module according to the first clock signal, and the first reset module is turned on, which allows the first input signal, inputted through the first input terminal of the shift register, to be shiftingly outputted through the first output terminal of the shift register. Then, the first reset module turns off the first shifting module according to a third clock signal, and outputs the first input signal, inputted through the first input terminal of the shift register, when the first shifting module is turned off so as to perform reset, thereby implementing the shifting output of the first input signal. The second shifting module is turned on at the same time as the first shifting module, such that the second input signal, inputted through the second input terminal of the shift register, is shiftingly outputted through the second output terminal of the shift register. Then the second shifting module is turned off by the third input module according to the second clock signal, and the second turning-on signal is outputted to the second reset module by the second input module according to the first clock signal so as to turn on the second reset module, and, after being turned on, the second reset module allows the second input signal inputted through the second input terminal of the shift register to be outputted so as to perform reset, thereby implementing the shifting output for the second input signal.

It can be seen from the foregoing that the shift register provided by the embodiment of the present invention can shiftingly output both two signals (i.e., the first and second input signals) which are used for controlling the scanning of gate lines and the data writing of data lines, respectively, and only one set of clock signals is required. Compared to an existing technical solution in which two set of clock signals are required, one additional set of clock signals is omitted, so the area occupied by the periphery circuit is reduced, thereby solving the problem of a too wide frame of a display device.

Figure 2:
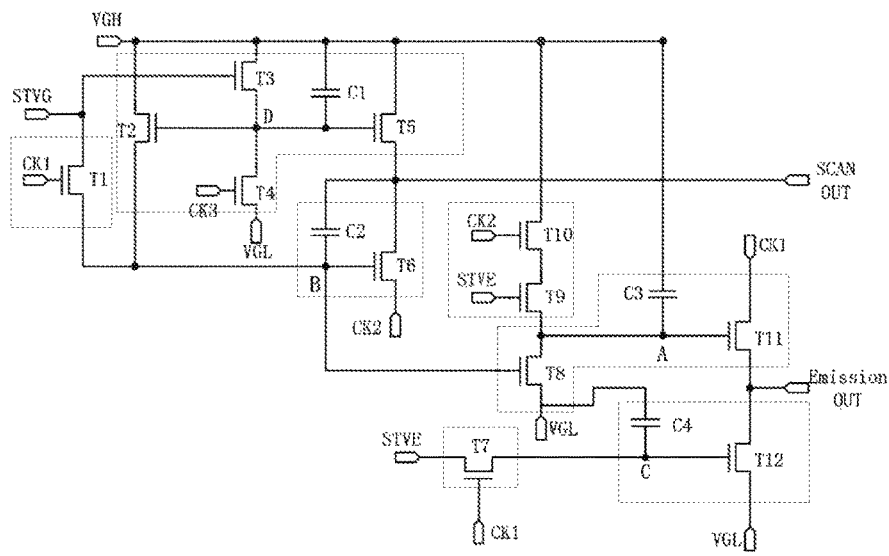
FIG. 2 is a circuit diagram of a shift register provided by an embodiment of the present invention.
Figure 3:
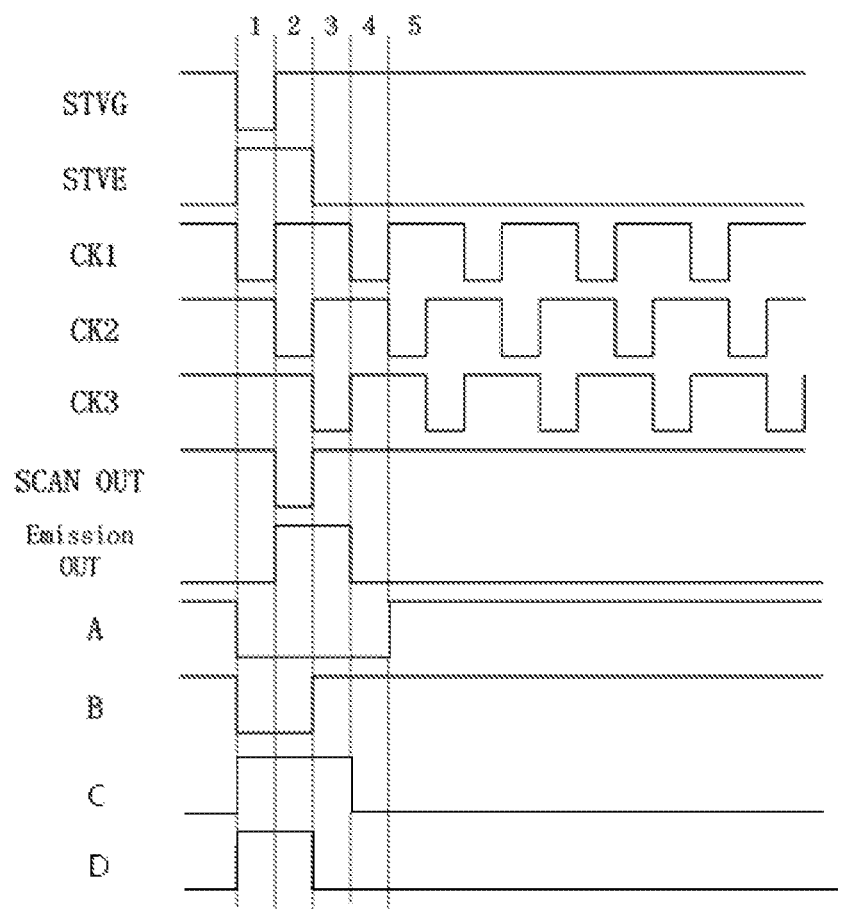
FIG. 3 is a timing diagram of the shift register shown in FIG. 2.

FIG. 2 is a specific circuit diagram of a shift register provided by an embodiment of the present invention. FIG. 3 is a timing diagram of the shift register as shown in FIG. 2. Specifically, referring to FIGS. 2 and 3, the shift register has a circuit structure of 12T4C, that is, a structure having twelve transistors and four capacitors. The first to twelfth transistors T1 to T12 are all P-type transistors. The first-level input terminal is configured to allow a first-level signal to be inputted therethrough, wherein the first-level signal is a high-level signal VGH. The second-level input terminal is configured to allow a second-level signal to be inputted therethrough, wherein the second-level signal is a low-level signal VGL. The first clock signal terminal is configured to allow the first clock signal CK1 to be inputted therethrough, the second clock signal terminal is configured to allow the second clock signal CK2 to be inputted therethrough, and the third clock signal terminal is configured to allow the third clock signal CK3 to be inputted therethrough. The first, second and third clock signals CK1, CK2 and CK3 belong to a same set of clock signals having a duty cycle of ⅓ and an effective signal as a low-level pulse, wherein the second clock signal CK2 is delayed by one third of clock period relative to the first clock signal CK1, and the third clock signal CK3 is delayed by one third of clock period relative to the second clock signal CK2.

The first input terminal of the shift register is configured to allow the first input signal (i.e., the signal STVG) to be inputted therethrough, and the second input terminal of the shift register is configured to allow the second input signal (i.e., the signal STVE) to be inputted therethrough. The signal STVG is one of a high-level signal superimposed with a low-level pulse and a low-level signal superimposed with a high-level pulse, and the signal STVE is the other. In this embodiment, specifically, the signal STVG is a high-level signal which is superimposed with a low-level pulse having a pulse width equal to one third of the clock period, i.e., a constantly high-level signal superimposed with a low-level pulse having a pulse width equal to one third of the clock period, and the signal STVE is a low-level signal which is superimposed with a high-level pulse having a pulse width equal to two thirds of the clock period, i.e., a constantly low-level signal superimposed with a high-level pulse having a pulse width equal to one third of the clock period. The pulses of the signals STVG and STVE start at a same time.

The first output terminal of the shift register is configured to allow the shifted signal (hereinafter referred to as the signal SCAN OUT, or the first output signal) of the first input signal (i.e., the signal STVG) to be outputted therethrough, which is used for controlling the scanning of gate lines, and the second output terminal of the shift register is configured to allow the shifted signal (hereinafter referred to as the signal Emission OUT, or the second output signal) of the second input signal (i.e., the signal STVE) to be outputted therethrough, which is used for controlling the data writing of data lines.

Specifically, as shown in FIG. 2, the first input module includes a first transistor T1. A control electrode of the first transistor T1 is connected to the first clock signal terminal, a first electrode of the first transistor T1 is connected to the first input terminal of the shift register and serves as an input terminal of the first input module, and a second electrode of the first transistor T1 is connected to input terminals of the first and second shifting modules and serves as an output terminal of the first input module. Here, the control electrode refers to a gate electrode of a transistor, and the first electrode refers to one of a drain and a source of a transistors and the second electrode refers to the other.

The first shifting module includes a sixth transistor T6 and a second storage capacitor C2. A control electrode of the sixth transistor T6 is connected to the output terminal of the first input module (i.e., the second electrode of the first transistor T1) and serves as the input terminal of the first shifting module, a first electrode of the sixth transistor T6 is connected to the first output terminal of the shift register and serves as an output terminal of the first shifting module, and a second electrode of the sixth transistor. T6 is connected to the second clock signal terminal. A first end of the second storage capacitor C2 is connected to the first electrode of the sixth transistor T6, and a second end of the second storage capacitor C2 is connected to the control electrode of the sixth transistor T6.

The first reset module includes a second transistor T2, a third transistor T3, a fourth transistor T4, a fifth transistor T5 and a first storage capacitor C1. A control electrode of the third transistor T3 is connected to the first input terminal of the shift register, a first electrode of the third transistor T3 is connected to a first-level input terminal, and a second electrode of the third transistor T3 is connected to a control electrode of the fifth transistor T5. A first electrode of the fifth transistor T5 is connected to the first electrode of the third transistor T3, and a second electrode of the fifth transistor T5 is connected to the first output terminal of the shift register and serves as an output terminal of the first reset module. Specifically, the second electrode of the fifth transistor T5 is also connected to the output terminal (i.e., the first electrode of the sixth transistor T6) of the first shifting module at a connection node serving as the first output terminal of the shift register. A control electrode of the second transistor T2 is connected to the second electrode of the third transistor. T3, a first electrode of the second transistor T2 is connected to the first-level input terminal, and a second electrode of the second transistor T2 is connected to the input terminal (i.e., the control electrode of the sixth transistor T6) of the first shifting module. A first end of the first storage capacitor C1 is connected to the first electrode of the fifth transistor T5, and a second end of the first storage capacitor C1 is connected to the control electrode of the fifth transistor T5. A control electrode of the fourth transistor T4 is connected to the third clock signal terminal, a first electrode of the fourth transistor T4 is connected to the second electrode of the third transistor T3, and a second electrode of the fourth transistor T4 is connected to a second-level input terminal.

The second input module includes a seventh transistor T7. A control electrode of the seventh transistor T7 is connected to the first clock signal terminal, a first electrode of the seventh transistor T7 is connected to the second input terminal of the shift register and serves as an input terminal of the second input module, and a second electrode of the seventh transistor T7 is connected to an input terminal of the second reset module and serves as an output terminal of the second input module.

The second reset module includes a fourth storage capacitor C4 and a twelfth transistor T12. A control electrode of the twelfth transistor T12 is connected to the output terminal of the second input module and serves as the input terminal of the second reset module, a first electrode of the twelfth transistor T12 is connected to the second output terminal of the shift register and serves as an output terminal of the second reset module, and a second electrode of the twelfth transistor T12 is connected to the second-level input terminal. A first end of the fourth storage capacitor C4 is connected to the control electrode of the twelfth transistor T12, and a second end of the fourth storage capacitor C4 is connected to the second-level input terminal.

The second shifting module includes an eighth transistor T8, an eleventh transistor T11 and a third storage capacitor C3. A control electrode of the eighth transistor T8 is connected to the input terminal (i.e., the control electrode of the sixth transistor T6) of the first shifting module and serves as an input terminal of the second shifting module, a first electrode of the eighth transistor T8 is connected to a control electrode of the eleventh transistor T11, and a second electrode of the eighth transistor T8 is connected to the second-level input terminal. The control electrode of the eleventh transistor T11 is connected to an output terminal of the third input module, a first electrode of the eleventh transistor T11 is connected to the first clock signal terminal, and a second electrode of the eleventh transistor T11 is connected to the second output terminal of the shift register and serves as an output terminal of the second shifting module. Specifically, the output terminal (i.e., the first electrode of the twelfth transistor T12) of the second reset module is also connected to the second electrode of the eleventh transistor T11 at a connection node serving as the second output terminal of the shift register. A first end of the third storage capacitor C3 is connected to the first-level input terminal, and a second end of the third storage capacitor C3 is connected to the control electrode of the eleventh transistor T11.

The third input module comprises a ninth transistor T9 and a tenth transistor T10. A control electrode of the tenth transistor T10 is connected to the second clock signal terminal, a first electrode of the tenth transistor T10 connected to the first-level input terminal, and a second electrode of the tenth transistor T10 is connected to a first electrode of the ninth transistor T9. A control electrode of the ninth transistor T9 is connected to the second input terminal of the shift register, and a second electrode of the ninth transistor T9 is connected to the second shifting module (i.e., the control electrode of the eleventh transistor T11) and serves as the output terminal of the third input module.

Hereinafter, the operating process of the shift register provided by the embodiment of the present invention will be described in conjunction with FIGS. 2 and 3. Observation nodes are set in the circuit for convenience of explaining voltage jumps in the circuit. Specifically, as shown in FIG. 2, a node at which the second electrode of the ninth transistor T9, the first electrode of the eighth transistor T8, the second end of the third storage capacitor C3 and the control electrode of the eleventh transistor T11 are electrically connected with each other is set as the node A. A node at which the second electrode of the first transistor T1, the second electrode of the second transistor T2, the control electrode of the sixth transistor T6, the control electrode of the eighth transistor T8 and the second end of the second storage capacitor C2 are electrically connected with each other is set as the node B. A node at which the second electrode of the seventh transistor T7, the control electrode of the twelfth transistor T12 and the first end of the fourth storage capacitor C4 are electrically connected with each other is set as the node C. A node at which the control electrode of the second transistor T2, the second electrode of the third transistor T3, the first electrode of the fourth transistor T4, the second end of the first storage capacitor C1 and a control electrode of the fifth transistor T5 are electrically connected with each other is set as the node D. In this embodiment, the first-level signal VGH is at a high level and the second-level signal VGL is at a low level, but the present inventive concept is not limited thereto. The first and second levels can be selected depending on specific circuit type.

In the first stage, the signal STVG and the first clock signal CK1 are both at the low level, and the signal STVE, the second clock signal CK2 and the third clock signal CK3 are all at the high level. In this case, the first transistor T1, the third transistor T3 and the seventh transistor T7 are turned on, and the fourth transistor T4, the ninth transistor T9 and the tenth transistor T10 are turned off. The signal STVG at the low level is transmitted to the node B via the first transistor T1, so that the voltage of the node B is pulled down to turn on the eighth transistor T8. The second-level signal VGL is transmitted to the node A via the eighth transistor T8, so that the voltage of node A is pulled down to turn on the eleventh transistor T11, and the first clock signal CK1 is outputted via the eleventh transistor T11, that is to say, at this time, the signal Emission OUT (i.e., the second output signal) is the first clock signal CK1, which is at the low level. Since the seventh transistor T7 is turned on, the signal STVE at the high level is transmitted to the node C via the seventh transistor T7, so that the voltage of the node C is pulled up to turn off the twelfth transistor T12. Since the third transistor T3 is turned on, the first-level signal VGH is transmitted to the node D via the third transistor T3, so that the voltage of the node D is pulled up to turn off the fifth and second transistors T5 and T2. The sixth transistor T6 is turned on due to the pulled-down voltage of the node B, and the second clock signal CK2 is outputted via the sixth transistor T6, that is to say, at this time, the signal SCAN OUT (i.e., the first output signal) is the second clock signal CK2, which is at the high level.

In the second stage, the second clock signal CK2 is at the low level, and the signal STVG, the signal STVE, the first clock signal CK1 and the third clock signal CK3 are all at the high level. In this case, the first transistor T1, the third transistor T3, the fourth transistor T4, the seventh transistor T7 and the ninth transistor T9 are all turned off, and the tenth transistor T10 is turned on. In addition, the voltage of the node B is pulled lower due to the second storage capacitor C2, so the six and eighth transistors T6 and T8 are turned on, so that the voltage of the node A is still at the low level, which turns on the eleventh transistor T11. The second clock signal CK2 is outputted via the sixth transistor T6, that is to say, at this time, the signal Emission OUT (i.e., the first output signal) is the second clock signal CK2, which is at the low level. The first clock signal CK1 is outputted via the eleventh T11, that is to say, at this time, the signal Emission OUT (i.e., the second output signal) is the first clock signal CK1, which is at the high level. The voltage of the node D is maintained in high level due to the first storage capacitor C1, which turns off both the second and fifth transistors T2 and T5, and the voltage of the node C is maintained in high level due to the fourth storage capacitor C4, which turns off the twelfth transistors T12.

In the third stage, the signal STVE and the third clock signal CK3 are both at the low level, and the signal STVG, the first clock signal CK1 and the second clock signal CK2 are all at the high level. In this case, the first transistor T1, the third transistor T3, the seventh transistor T7, the ninth transistor T9 and the tenth transistor T10 are all turned off, and the fourth transistor T4 is turned on. The second-level signal VGL is outputted to the node D via the fourth transistor T4, so that the voltage of the node D is pulled down to turn on the second and fifth transistors T2 and T5. The first-level signal VGH is outputted via the fifth transistor T5, and, at this time, the signal SCAN OUT (i.e., the first output signal) is at the first level VGH. The first-level signal VGH is outputted to the node B via the second transistor T2, so that the voltage of the node B is pulled up to turn off the sixth and eighth transistors T6 and T8. However, due to the third storage capacitor C3, the voltage of the node A is still at the low level, so that the eleventh transistor T11 is turned on and the first clock signal CK1 is outputted via the eleventh transistor T11, that is to say, at this time, the second output signal (i.e., the signal Emission OUT) is the first clock signal CK1, which is at the high level. The voltage of the node C is still at the high level due to the fourth storage capacitor C4, so that the twelfth transistor T12 is turned off.

In the fourth stage, the signal STVE and the first clock signal CK1 are both at the low level, and the signal STVG, the second clock signal CK2 and the third clock signal CK3 are all at the high level. In this case, the third transistor T3, the fourth transistor T4 and the tenth transistor T10 are all turned off, and the first transistor T1, the seventh transistor T7 and the ninth transistor T9 are all turned on. The signal STVG at the high level is transmitted to the node B, and the voltage of the node D is still at the low level due to the first storage capacitor C1, so that the second and fifth transistors T2 and T5 are turned on. The first-level signal VGH is transmitted to the node B via the second transistor T2, so that the voltage of the node B is at the high level, and the first-level signal VGH is outputted via the fifth transistor T5, so the signal SCAN OUT (i.e., the first output signal) is at the first level VGH. The sixth and eighth transistors T6 and T8 are turned off due to the high-level voltage of the node B; however, the voltage of the node A is still at the low level due to the third storage capacitor C3, so that the eleventh transistor T11 is turned on and the first clock signal CK1 is outputted through the eleventh transistor T11, that is to say, at this time, the signal Emission OUT (i.e., the second output signal) corresponds to the first clock signal CK1, which is at the low level. In addition, the voltage of the node C is at the low level due to the turning on of the seventh transistor T7, so that the twelfth transistor T12 is turned on, and the second-level signal VGL is outputted through the twelfth transistor T12, that is to say, at this time, the signal Emission OUT (i.e., the second output signal) is at the second level VGL.

In the fifth stage, the signal STVE and the second clock signal CK2 are both at the low level, and the signal STVG, the first clock signal CK1 and the third clock signal CK3 are both at the high level. In this case, the first transistor T1, the third transistor T3, the fourth transistor T4 and the seventh transistor T7 are all turned off, and the tenth transistor T10 and the ninth transistor T9 are both turned on. In addition, the voltage of the node D is still at the low level VGL due to the first storage capacitor C1, so that the second and fifth transistors T2 and T5 are turned on. The first-level signal VGH is transmitted to the node B via the second transistor T2, so that the voltage of the node B is at the high level, and the first-level signal VGH is outputted via the fifth transistor T5, which allows the signal SCAN OUT (i.e., the first output signal) to be the first level VGH. The sixth and eighth transistors T6 and T8 are turned off due to the high-level voltage of the node B; however, since the ninth and tenth transistors T9 and T10 are turned on, the first-level signal VGH is transmitted to the node A via the ninth and tenth transistors T9 and T10, so that the voltage of the node A is pulled up to the high level to turn off the eleventh transistor T11. The voltage of the node C is still at the low level due to the fourth storage capacitor C4, so that the twelfth transistor T12 is turned on, and the second-level signal VGL is outputted via the twelfth transistor T12, that is to say, at this time, the signal Emission OUT (i.e., the second output signal) is at the second level VGL.

The above first to fifth stages correspond to steps for shifting the two signals used to control the scanning of gate lines and the data writing of data lines during the display of a frame of image, wherein the fifth stage will be continued until the display of the next frame of image is started.

It can be understood that the shift register as shown in FIG. 2 has a specific circuit structure of 12T4C. Compared to the existing structure of 18T5C consisting of two shift registers with single input channel and single output channel, the numbers of transistors T and capacitors C are reduced, thereby saving cost and reducing the area occupied by the circuit.

Figure 4:
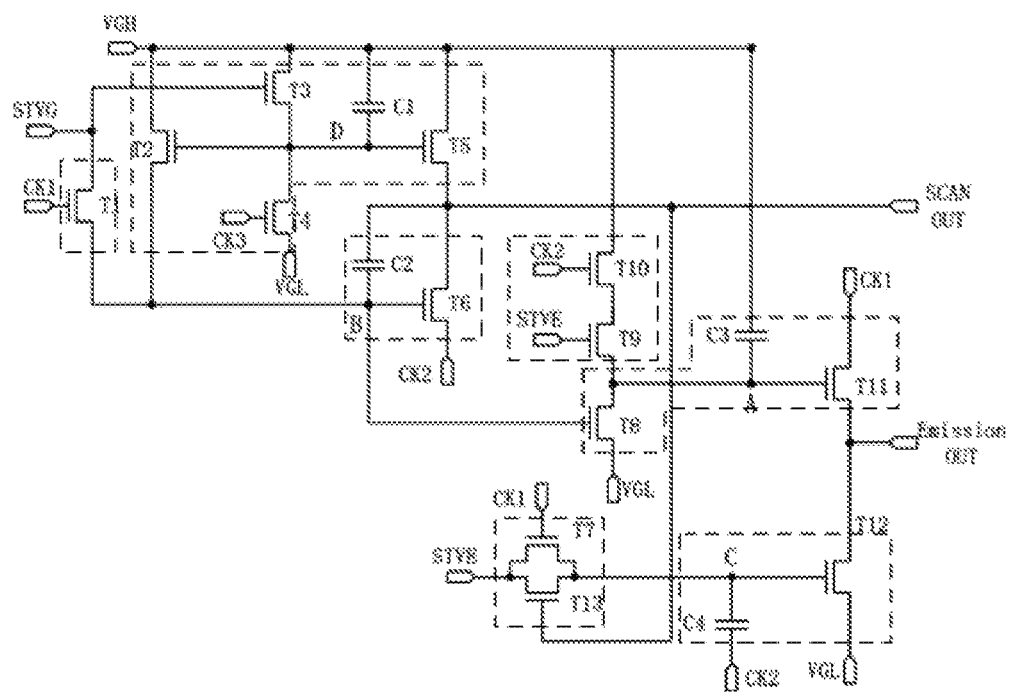
FIG. 4 is a circuit diagram of a shift register provided by another embodiment of the present invention.
Figure 5:
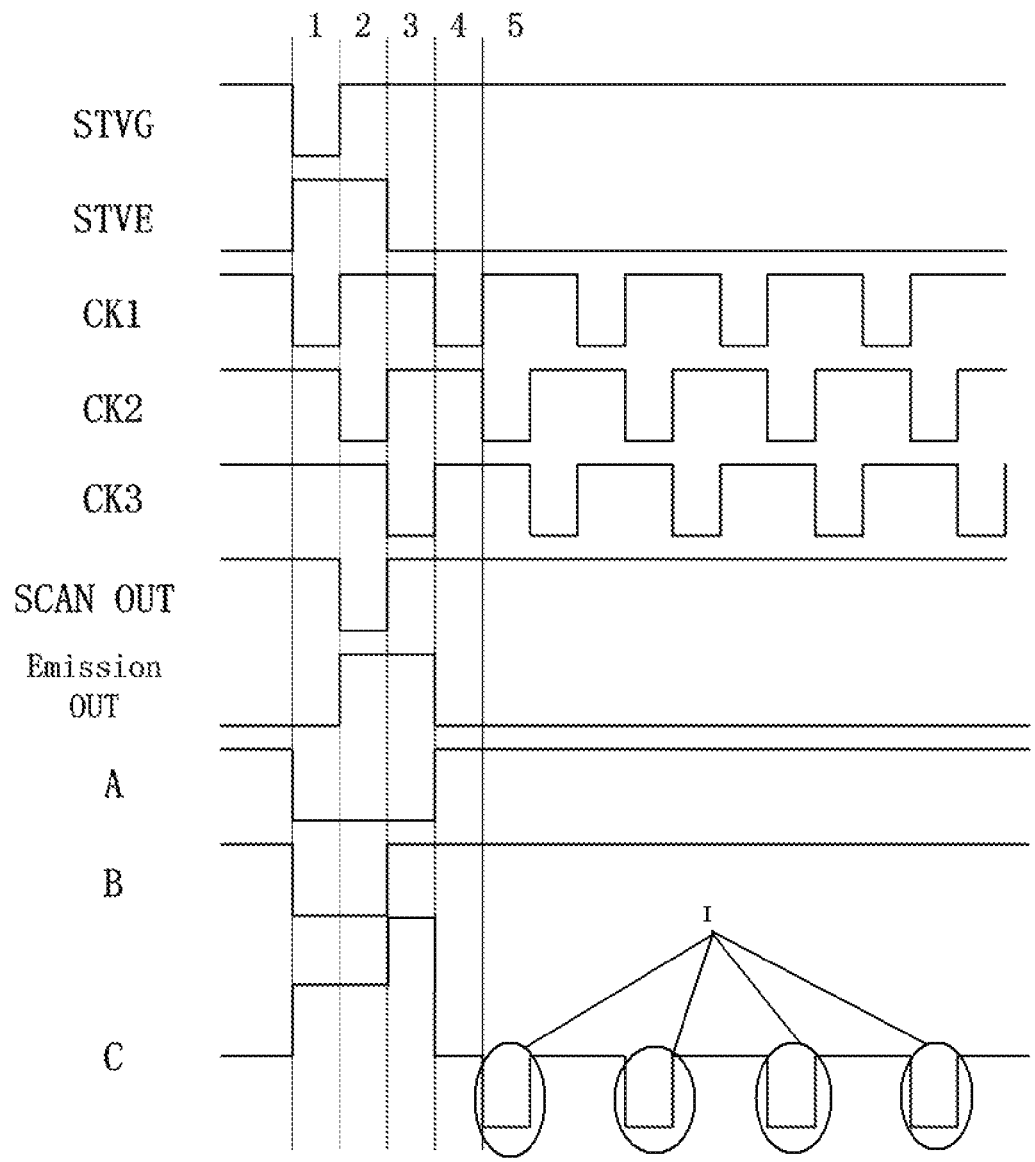
FIG. 5 is a timing diagram of the shift register shown in FIG. 4.

It should be noted that, with reference to FIGS. 4 and 5, it is preferable that the second input module further includes a thirteenth transistor T13, which has a control electrode connected to the first output terminal of the shift register, a first electrode connected to the first electrode of the seventh transistor T7, and a second electrode connected to the second electrode of the seventh transistor T7, and wherein the second end of the fourth storage capacitor C4 in the second reset module is connected to the second clock signal terminal, instead of being connected to the second-level terminal VGL as shown in FIG. 2. In this case, the above second stage further includes that, the signal STVE is at the high level due to the fact that the signal SCAN OUT (i.e., the first output signal) is at the low level, so that the thirteenth transistor T13 is turned on, and the signal STVE is transmitted to the node C via the thirteenth transistor T13, so as to proceed to charge the node C to a higher level. The above third stage further includes that, the voltage difference between the two ends of the fourth storage capacitor C4 is maintained at the value obtained in the second stage, and the second clock signal CK2 is changed from the low level to the high level, so the voltage of the node C is pulled up higher than the high level of the second clock signal CK2, as shown in FIG. 5, which may turn off the twelfth transistor T12 more reliably. The above fifth stage further includes that, since the second clock signal CK2 is changed from the high level to the low level and the voltage at the node C (i.e., the first end of the fourth storage capacitor C4) obtained in the fourth stage is less than the voltage at the second end of the fourth storage capacitor C4, when the voltage at the second end of the fourth storage capacitor C4 is decreased by an amount identical to (VGH–VGL), the voltage at the node C is decreased from the voltage level VGL by the amount of (VGH–VGL); in doing so, the voltage at the node C is much less than the voltage level VGL (as shown in the region I of the voltage signal for the node C illustrated in FIG. 5), so that the twelfth transistor T12 is turned on to rapidly provide charges to the load. This can solve the problem that the second output signal (i.e., the signal Emission OUT) cannot keep stable when the output load varies, thereby enhancing the capability of resisting interference for the shift register. In addition, the second end of the fourth storage capacitor C4 may be connected to the second clock signal terminal without providing the thirteenth transistor T13 shown in FIG. 4, and in this case, the voltage at the node C can also be pulled up higher the high level of the second clock signal CK2 during the third period, as shown in FIG. 5, which may turn off the twelfth transistor T12 more reliably.

It should be also noted that the first to twelfth transistor T1 to T12 in the circuit of the above embodiment of the present invention as shown in FIG. 2 are all P-type transistors, but the present invention is not limited thereto, the first to twelfth transistor T1 to T12 in the circuit as shown in FIG. 2 may also be N-type transistors in practice. In this case, the only thing that needs to be done is reversing the low-level portions of the first input signal STVG, the second input signal STVE, the first clock signal CK1, the second clock signal CK2 and the third clock signal CK3 as shown in FIG. 3 to a high level while reversing the high-level portions thereof to a low level, and setting the first level VGH to be the low level and the second level VGL to be the high level.

It should be also noted that the first input module, the second input module, the third input module, the first shifting module, the second shifting module, the first reset module and the second reset module are not limited to the above structures, and other circuit structures may be adopted. For example, the eleventh transistor T11 of the second shifting module is an N-type transistor, a connection node, at which the first electrode of the tenth transistor T10 is connected to the second end of the third storage capacitor C3, is connected to the second-level terminal VGL, and the second electrode of the eighth transistor T8 is connected to the first level VGH. In this case, a part of the first to twelfth transistors are P-type transistors, and remaining part of the first to twelfth transistors are N-type transistors.

As another aspect, the present invention also provides a display device including the shift register according to the above embodiment.

Since the shift register according to the embodiment of the present invention is employed in the display device, the problem of a too wide frame of a display device can be solved.

As another technical solution, the present invention also provides a method for driving the shift register provided by the above embodiment, which includes the following steps:

a shift outputting step, in which the first and second input modules are turned on, the first and second shifting modules are turned on by the first input module, the second reset module is turned off by the second input module, the first shifting module shiftingly outputs the first input signal inputted through the first input terminal of the shift register (that is, the first input signal is shiftingly outputted through the first output terminal of the shift register), and the second shifting module shiftingly outputs the second input signal inputted through the second input terminal of the shift register (that is, the second input signal is shiftingly outputted through the second output terminal of the shift register); and a reset outputting step, in which the first reset module, the second input module and the third input module are turned on, the first shifting module is turned off by the first reset module, the second reset module is turned on by the second input module, the second shifting module is turned off by the third input module, the first reset module outputs the first input signal (that is, a voltage at the first output terminal of the shift register is reset), and the second reset module outputs the second input signal (that is, a voltage at the second output terminal of the shift register is reset).

It can be seen from the foregoing that the first and second input signals can be shiftingly outputted by performing the shift outputting step and the reset outputting step. Therefore, by using of the method for driving the shift register provided by the present invention, both the first and second input signals, which are used for controlling the scanning of gate lines and the data writing of data lines, can be shiftingly outputted respectively, and only one set of clock signals is required. Compared to existing technical solutions, one additional set of clock signals is omitted, so the area occupied by the periphery circuit is reduced, thereby solving the problem of a too wide frame of a display device.

Specifically, in this embodiment, the first input signal is one of a high-level signal superimposed with a low-level pulse and a low-level signal superimposed with a high-level pulse, and the second input signal is the other. The pulse width of the first input signal is equal to one third of the clock period, and the pulse width of the second input signal is equal to two thirds of the clock period. The pulses of the first and second input signals start at a same time. The first, second and third clock signals have a duty cycle of ⅓, the second clock signal is delayed by one third of clock period relative to the first clock signal, and the third clock signal is delayed by one third of clock period relative to the second clock signal.

In this case, the method for driving the shift register includes the following steps.

In a first stage, the first clock signal is active to turn on the first and second input modules, the first and second shifting modules are turned on by the first input module, the second reset module is turned off by the second input module, the first shifting module outputs an inverted signal of the first input signal, and the second shifting module outputs an inverted signal of the second input signal.

In a second stage, the second clock signal is active, the first and second input modules are turned off, the first and second shifting modules both are maintained in the on state, the second reset module is maintained in the off state, the first shifting module outputs the inverted signal of the first input signal, and the second shifting module outputs the second input signal.

In a third stage, the third clock signal is active, the first input module, the second input module and the second reset module all are maintained in the off state, the second shifting module is maintained in the on state, the first reset module is turned on, the first reset module is turned off by the first reset module, the first reset module outputs the first input signal, and the second shifting module outputs an inverted signal of the second input signal.

In a fourth stage, the first clock signal is active, the first and second input modules are turned on, the first shifting module is turned off by the first input module, the second reset module is turned on by the second input module, the first reset module and the second shifting module both are maintained in the on state, the first reset module outputs the first input signal, and the second shifting module and/or the second reset module output the second input signal.

In a fifth stage, the second clock signal is active, the first and second input modules are turned off, the third input module is turned on, the second shifting module is turned off by the third input module, the first shifting module is maintained in the off state, the first and second reset modules both are maintained in the on state, the first reset module outputs the first input signal, and the second reset module outputs the second input signal.

The above first to fifth stages correspond to steps for shifting and resetting the two signals used to control the scanning of gate lines and the data writing of data lines during the display of a frame of image, wherein the fifth stage will be continued until the display the next frame of image is started.

Hereinafter, the method for driving the shift register provided by this embodiment will be described under the assumption that the first input signal is a high-level signal superimposed with a low-level pulse having a pulse width equal to one third of the clock period, such as the signal STVG shown in FIG. 3, and the second input signal is a low-level signal superimposed with a high-level pulse having a pulse width equal to two thirds of the clock period, such as the signal STVE shown in FIG. 3. In the first stage, since the first input signal is at the low level and the second input signal is at the high level, the inverted signal of the first input signal outputted by the first shifting module (that is, outputted through the first output terminal of the shift register) is at the high level, and the inverted signal of the second input signal outputted by the second shifting module (that is, outputted through the second output terminal of the shift register) is at the low level. In the second stage, since the first input signal is at the high level and the second input signal is at the high level, the inverted signal of the first input signal outputted by the first shifting module is at the low level, and the inverted signal of the second input signal outputted by the second shifting module is at the high level. In the third stage, since the first input signal is at the high level and the second input signal is at the low level, the first input signal outputted by the first reset module (that is, outputted through the first output terminal of the shift register) is at the high level, and the inverted signal of the second input signal outputted by the second shifting module is at the high level. In the fourth stage, since the first input signal is at the high level and the second input signal is at the low level, the first input signal outputted by the first reset module is at the high level, and the second input signal outputted by the second shifting module and/or the second reset module (that is, outputted through the second output terminal of the shift register) is at the low level. In the fifth stage, since the first input signal is at the high level and the second input signal is at the low level, the first input signal outputted by the first reset module is at the high level, and the second input signal outputted by the second reset module is at the low level. According to the above first to fifth stages, the signals outputted through the first and second output terminals of the shift register may correspond to the signal SCAN OUT and the signal Emission OUT as shown in FIG. 3, respectively. Therefore, by using the method for driving the shift register provided by the present embodiment, the first and second input signals having different pulse widths and pulse signals can be shifted simultaneously.

Alternatively, it may be also assumed that the first input signal is a low-level signal superimposed with a high-level pulse having a pulse width equal to one third of the clock period, and the second input signal is a high-level signal superimposed with a low-level pulse having a pulse width equal to two thirds of the clock period. In this case, according to the method for driving the shift register provided by this embodiment, an inverted signal of the signal SCAN OUT shown in FIG. 3 is outputted through the first output terminal of the shift register, an inverted signal of the signal Emission OUT shown in FIG. 3 is outputted through the second output terminal of the shift register.

Preferably, the first, second and third clock signals have the same effective signal level as the pulse level of the first input signal, which is either the low level or the high level. In this case, in the first stage, the first shifting module outputs the second clock signal and the second shifting module outputs the first clock signal; in the second stage, the first shifting module outputs the second clock signal and the second shifting module outputs the first clock signal; in the third stage, the first reset module outputs the first input signal, and the second shifting module outputs the first clock signal; in the fourth stage, the first reset module outputs the first input signal, and the second shifting module outputs the first clock signal and/or the second reset module outputs the second input signal; and in the fifth stage, the first reset module outputs the first input signal, and the second reset module outputs the second input signal.

For example, if the first input signal corresponds to the signal STVG as shown in FIG. 3, the effective signal level is the low level. So the first to third clock signals correspond to the signals CK1 to CK3 as shown in FIG. 3, respectively. In the first stage, the second clock signal CK2 outputted by the first shifting module (that is, outputted through the first output terminal of the shift register) is at the high level, and the first clock signal CK1 outputted by the second shifting module (that is, outputted through the second output terminal of the shift register) is at the low level. In the second stage, the second clock signal CK2 outputted by the first shifting module is at the low level, and the first clock signal CK1 outputted by the second shifting module is at the high level. In the third stage, the signal STVG outputted by the first reset module (that is, outputted through the first output terminal of the shift register) is at the high level, and the first clock signal CK1 outputted by the second shifting module is at the high level. In the fourth stage, the signal STVG outputted by the first reset module is at the high level, and the first clock signal CM outputted by the second shifting module is at the low level and/or the second input signal outputted by the second reset module (that is, outputted through the second output terminal of the shift register) is at the low level. In the fifth stage, the signal STVG outputted by the first reset module is at the high level, and the second input signal outputted by the second reset module is at the low level. According to the above first to fifth stages, the signals outputted through the first and second output terminals of the shift register may correspond to the signal SCAN OUT and the signal Emission OUT as shown in FIG. 3, respectively.

It should be noted that, in practice, the method for driving a shift register provided by this embodiment may also be used under the following conditions: a sum of the pulse widths of the first and second input signals is equal to the clock period of the first, second and third clock signals; the first, second and third clock signals have an effective signal width equal to the pulse width of the first input signal and a duty cycle less than ½; and, the second clock signal is delayed by the effective signal width thereof relative to the first clock signal, and the third clock signal is delayed by the effective signal width thereof relative to the second clock signal. For example, the duty cycle of the pulse width of the first input signal and the duty cycles of the pulse widths of the first, second and third clock signals all equal to ¼, the second clock signal is delayed by one fourth of the clock period relative to the first clock signal, the third clock signal is delayed by one fourth of the clock period relative to the second clock signal, and the duty cycle of the pulse width of the second input signal equals to ¾.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

What is claimed is:

1. A shift register, including a first input module, a second input module, a third input module, a first shifting module, a second shifting module, a first reset module and a second reset module, wherein the first input module is connected with a first input terminal of the shift register, the first shifting module and the second shifting module, and is configured to output a first turning-on signal to the first shifting module and the second shifting module according to a first clock signal;

the first shifting module has an output terminal connected to a first output terminal of the shift register, and is configured to be turned on when receiving the first turning-on signal and shiftingly output a first input signal inputted by the first input terminal;

the first reset module is connected with the first input terminal and the first shifting module and has an output terminal connected to the first output terminal of the shift register, and is configured to turn off the first shifting module according to a third clock signal and output the first input signal when the first shifting module is turned off so as to perform reset;

the second shifting module has an output terminal connected to a second output terminal of the shift register, and is configured to be turned on when receiving the first turning-on signal and shiftingly output a second input signal inputted by a second input terminal of the shift register;

the second input module is connected with the second input terminal and the second reset module, and is configured to output a second turning-on signal or a turning-off signal to the second reset module according to the first clock signal;

the second reset module has an output terminal connected to the second output terminal, and is configured to be turned on when receiving the second turning-on signal and output the second input signal so as to perform reset;

the third input module is connected with the second input terminal and the second shifting module, and is configured to turn off the second shifting module according to a second clock signal; and wherein the first clock signal, the second clock signal and the third clock signal are a set of clock signals having a same clock period and a same duty cycle.

2. The shift register according to claim 1, wherein the first input module includes a first transistor, which has a control electrode connected to a first clock signal terminal, a first electrode connected to the first input terminal and serving as an input terminal of the first input module, and a second electrode connected to an input terminal of the first shifting module and serving as an output terminal of the first input module, the first clock signal terminal being configured to allow the first clock signal to be inputted therethrough.

3. The shift register according to claim 1, wherein the first shifting module includes a sixth transistor and a second storage capacitor, a control electrode of the sixth transistor being connected to an output terminal of the first input module and serving as an input terminal of the first shifting module, a first electrode of the sixth transistor serving as the output terminal of the first shifting module, and a second electrode of the sixth transistor being connected to a second clock signal terminal;

the second clock signal terminal being configured to allow the second clock signal to be inputted therethrough; and a first end of the second storage capacitor being connected to the first electrode of the sixth transistor, and a second end of the second storage capacitor being connected to the control electrode of the sixth transistor.

4. The shift register according to claim 1, wherein the first reset module includes a second transistor, a third transistor, a fourth transistor, a fifth transistor and a first storage capacitor, a control electrode of the third transistor being connected to the first input terminal, a first electrode of the third transistor being connected to a first-level input terminal, and a second electrode of the third transistor being connected to a control electrode of the fifth transistor;

the first-level input terminal being configured to allow a first-level signal to be inputted therethrough;

a first electrode of the fifth transistor being connected to the first electrode of the third transistor, and a second electrode of the fifth transistor serving as an output terminal of the first reset module;

a control electrode of the second transistor being connected to the second electrode of the third transistor, a first electrode of the second transistor being connected to the first-level input terminal, and a second electrode of the second transistor being connected to an input terminal of the first shifting module;

a first end of the first storage capacitor being connected to the first electrode of the fifth transistor, and a second end of the first storage capacitor being connected to the control electrode of the fifth transistor;

a control electrode of the fourth transistor being connected to a third clock signal terminal, a first electrode of the fourth transistor being connected to the second electrode of the third transistor, and a second electrode of the fourth transistor being connected to a second-level input terminal;

the third clock signal terminal being configured to allow the third clock signal to be inputted therethrough; and the second-level input terminal being configured to allow a second-level signal to be inputted therethrough, the first level being one of a high level and a low level, and the second level being the other.

5. The shift register according to claim 1, wherein the second input module includes a seventh transistor, a control electrode of the seventh transistor being connected to the first clock signal terminal, a first electrode of the seventh transistor being connected to the second input terminal and serving as an input terminal of the second input module, and a second electrode of the seventh transistor being connected to an input terminal of the second reset module and serving as an output terminal of the second input module; and the first clock signal terminal being configured to allow the first clock signal to be inputted therethrough.

6. The shift register according to claim 5, wherein the second input module further includes a thirteenth transistor, a control electrode of the thirteenth transistor being connected to the first output terminal, a first electrode of the thirteenth transistor being connected to the first electrode of the seventh transistor, and a second electrode of the thirteenth transistor being connected to the second electrode of the seventh transistor.

7. The shift register according to claim 1, wherein the second reset module includes a fourth storage capacitor and a twelfth transistor, a control electrode of the twelfth transistor being connected to an output terminal of the second input module and serving as an input terminal of the second reset module, a first electrode of the twelfth transistor serving as an output terminal of the second reset module, and a second electrode of the twelfth transistor being connected to a second-level input terminal;

the second-level input terminal being configured to allow a second-level signal to be inputted therethrough;

a first end of the fourth storage capacitor being connected to the control electrode of the twelfth transistor, and a second end of the fourth storage capacitor being connected to the second-level input terminal.

8. The shift register according to claim 1, wherein the second reset module includes a fourth storage capacitor and a twelfth transistor, a control electrode of the twelfth transistor being connected to an output terminal of the second input module and serving as an input terminal of the second reset module, a first electrode of the twelfth transistor serving as an output terminal of the second reset module, and a second electrode of the twelfth transistor being connected to a second-level input terminal;

the second-level input terminal being configured to allow a second-level signal to be inputted therethrough;

a first end of the fourth storage capacitor being connected to the control electrode of the twelfth transistor, and a second end of the fourth storage capacitor being connected to a second clock signal terminal; and the second clock signal terminal being configured to allow the second clock signal to be inputted therethrough.

9. The shift register according to claim 1, wherein the second shifting module includes an eighth transistor, an eleventh transistor and a third storage capacitor, a control electrode of the eighth transistor being connected to an input terminal of the first shifting module, a first electrode of the eighth transistor being connected to a control electrode of the eleventh transistor, and a second electrode of the eighth transistor being connected to a second-level input terminal;

the second-level input terminal being configured to allow a second-level signal to be inputted therethrough;

a control electrode of the eleventh transistor being connected to an output terminal of the third input module, a first electrode of the eleventh transistor being connected to a first clock signal terminal, and a second electrode of the eleventh transistor serving as the output terminal of the second shifting module;

the first clock signal terminal being configured to allow the first clock signal to be inputted therethrough;

a first end of the third storage capacitor being connected a the first-level input terminal, and a second end of the third storage capacitor being connected to the control electrode of the eleventh transistor;

the first-level input terminal being configured to allow a first-level signal to be inputted therethrough, the first level being one of a high level and a low level, and the second level being the other.

10. The shift register according to claim 1, wherein the third input module comprises a ninth transistor and a tenth transistor, a control electrode of the tenth transistor being connected to a second clock signal terminal, a first electrode of the tenth transistor connected to the first-level input terminal, and a second electrode of the tenth transistor being connected to a first electrode of the ninth transistor;

the second clock signal terminal being configured to allow the second clock signal to be inputted therethrough;

the first-level input terminal being configured to input a first-level signal;

a control electrode of the ninth transistor being connected to the second input terminal, and a second electrode of the ninth transistor being connected to the second shifting module and serving as an output terminal of the third input module.

11. The shift register according to claim 1, wherein the first input module, the second input module, the third input module, the first shifting module, the second shifting module, the first reset module and the second reset module include transistors, and wherein all of the transistors are P-type transistors.

12. The shift register according to claim 1, wherein the first input module, the second input module, the third input module, the first shifting module, the second shifting module, the first reset module and the second reset module include transistors, and wherein all of the transistors are N-type transistors.

13. The shift register according to claim 1, wherein the first input module, the second input module, the third input module, the first shifting module, the second shifting module, the first reset module and the second reset module include transistors, and wherein a part of the transistors are P-type transistors, and remaining part of the transistors are N-type transistors.

14. The shift register according to claim 1, wherein the first input signal is one of a high-level signal superimposed with a low-level pulse and a low-level signal superimposed with a high-level pulse, and the second input signal is the other;

a sum of pulse widths of the first input signal and the second input signal equals to the clock period;

the pulses of the first input signal and the second input signal start at a same time;

effective signal widths of the first clock signal, the second clock signal and the third clock signal are equal to the pulse width of the first input signal, a delay time for the second clock signal relative to the first clock signal is equal to the pulse width of the first input signal, and a delay time for the third clock signal relative to the second clock signal is equal to the pulse width of the first input signal.

15. The shift register according to claim 14, wherein the pulse width of the first input signal is equal to one third of the clock period, and the pulse width of the second input signal is equal to two thirds of the clock period.

16. A display device, including the shift register according to claim 1.

17. A method for driving the shift register according to claim 1, including the following steps:

a shift outputting step, in which the first input module and the second input module are turned on, the first shifting module and the second shifting module are turned on by the first input module, the second reset module is turned off by the second input module, the first shifting module shiftingly outputs the first input signal inputted through the first input terminal, and the second shifting module shiftingly outputs the second input signal inputted through the second input terminal; and a reset output step, in which the first reset module, the second input module and the third input module are turned on, the first shifting module is turned off by the first reset module, the second reset module is turned on by the second input module, the second shifting module is turned off by the third input module, the first reset module outputs the first input signal, and the second reset module outputs the second input signal.

18. The method according to claim 17, wherein the first input signal is one of a high-level signal superimposed with a low-level pulse and a low-level signal superimposed with a high-level pulse, and the second input signal is the other; a sum of pulse widths of the first input signal and the second input signal equals to the clock period; the pulses of the first input signal and the second input signal start at a same time; effective signal widths of the first clock signal, the second clock signal and the third clock signal are equal to the pulse width of the first input signal, a delay time for the second clock signal relative to the first clock signal is equal to the pulse width of the first input signal, and a delay time for the third clock signal relative to the second clock signal is equal to the pulse width of the first input signal; and wherein the method for driving the shift register includes the following steps:

in a first stage, the first clock signal is active, the first input module and the second input module are turned on, the first shifting module and the second shifting module are turned on by the first input module, the second reset module is turned off by the second input module, the first shifting module outputs an inverted signal of the first input signal, and the second shifting module outputs an inverted signal of the second input signal;

in a second stage, the second clock signal is active, the first input module and the second input module are turned off, the first shifting module and the second shifting module are maintained in the on state, the second reset module is maintained in the off state, the first shifting module outputs the inverted signal of the first input signal, and the second shifting module outputs the second input signal;

in a third stage, the third clock signal is active, the first input module, the second input module and the second reset module are maintained in the off state, the second reset module is maintained in the on state, the first reset module is turned on, the first shifting module is turned off by the first reset module, the first reset module outputs the first input signal, and the second shifting module outputs an inverted signal of the second input signal;

in a fourth stage, the first clock signal is active, the first input module and the second input module are turned on, the first shifting module is turned off by the first input module, the second reset module is turned on by the second input module, the first reset module and the second shifting module are maintained in the on state, the first reset module outputs the first input signal, and the second shifting module and/or the second reset module output the second input signal; and in a fifth stage, the second clock signal is active, the first input module and second input module are turned off, the third input module is turned on, the second shifting module is turned off by the third input module, the first shifting module is maintained in the off state, the first reset module and the second reset module are maintained in the on state, the first reset module outputs the first input signal, and the second reset module outputs the second input signal.

19. The method according to claim 18, wherein the pulse width of the first input signal is equal to one third of the clock period, and the pulse width of the second input signal is equal to two thirds of the clock period.

20. The method according to claim 18, wherein the first, second and third clock signals have an effective signal level equal to the pulse level of the first input signal, which is either a low level or a high level;

in the first stage, the first shifting module outputs the second clock signal, and the second shifting module outputs the first clock signal;

in the second stage, the first shifting module outputs the second clock signal, and the second shifting module outputs the first clock signal;

in the third stage, the first reset module outputs the first input signal, and the second shifting module outputs the first clock signal;

in the fourth stage, the first reset module outputs the first input signal, the second shifting module outputs the first clock signal, and/or the second reset module outputs the second input signal; and in the fifth stage, the first reset module outputs the first input signal, and the second reset module outputs the second input signal.

* * * * *